United States Patent
Livergood et al.

(10) Patent No.: US 11,196,481 B2
(45) Date of Patent: Dec. 7, 2021

(54) EMP-RESISTANT SATELLITE COMMUNICATIONS SYSTEM AND METHOD

(71) Applicant: John Moroney, Jupiter, FL (US)

(72) Inventors: George A. Livergood, Rogers, AK (US); Arthur G. Giftakis, Norwell, MA (US)

(73) Assignee: John Moroney, Jupiter, FL (US)

( * ) Notice: Subject to any disclaimer, the term of this patent is extended or adjusted under 35 U.S.C. 154(b) by 151 days.

(21) Appl. No.: 16/704,651

(22) Filed: Dec. 5, 2019

(65) Prior Publication Data

US 2021/0281319 A1 Sep. 9, 2021

Related U.S. Application Data

(60) Provisional application No. 62/775,456, filed on Dec. 5, 2018.

(51) Int. Cl.

| H04B 1/10 | (2006.01) |
|---|---|
| H05K 9/00 | (2006.01) |
| H01Q 1/00 | (2006.01) |
| H04B 7/185 | (2006.01) |
| H01Q 1/40 | (2006.01) |
| H01Q 21/00 | (2006.01) |

(52) U.S. Cl.
CPC .......... *H04B 7/18515* (2013.01); *H01Q 1/40* (2013.01); *H01Q 21/0006* (2013.01); *H05K 9/006* (2013.01)

(58) Field of Classification Search
CPC ......... H04W 4/14; H04W 28/02; H04W 4/22; H04W 52/02; H04W 56/00; H01Q 5/28; H01Q 1/00; H01Q 1/002; H01Q 1/22; H01Q 1/40; H01Q 21/006; H04B 7/185; H04B 7/18528; H04B 7/18515; H04B 1/10; H05K 9/006; H05K 9/00; H05K 9/0001; H05K 9/0006
See application file for complete search history.

(56) References Cited

U.S. PATENT DOCUMENTS

| 5,717,576 A | 2/1998 | Van Doeselaar |
|---|---|---|
| 6,597,255 B1 | 9/2003 | Turton |
| 6,822,876 B2 | 11/2004 | Goergen |
| 8,219,799 B1 | 7/2012 | Lucchesi |

(Continued)

OTHER PUBLICATIONS

"International Search Report and Written Opinion, PCT/US2019/64732".

*Primary Examiner* — Blane J Jackson
(74) *Attorney, Agent, or Firm* — Law Office of Mark Brown, LLC; Mark E. Brown

(57) ABSTRACT

An electromagnetic pulse (EMP) resistant telecommunications system includes core components mounted within and shielded by a Faraday cage. The components include a data source or storage device. An ethernet switch selectively connects the data source or storage device to a primary satellite router and a post-EMP satellite router. Telecommunications signals are output from and input to the core components via low noise blocks (LNBs) and block upconverters (BUCs). A method of resisting EMP interference for a telecommunications system includes the steps of enclosing and shielding core components in a Faraday cage and providing output via LNBs and BUCs to an antenna subsystem.

12 Claims, 1 Drawing Sheet

(56) References Cited

U.S. PATENT DOCUMENTS

| | | |
|---|---|---|
| 9,100,361 B1 | 8/2015 | Lucchesi |
| 2011/0280178 A1 | 11/2011 | Heifner |
| 2016/0157075 A1* | 6/2016 | Ho .......................... H04W 4/90 |
| | | 455/404.2 |
| 2017/0300654 A1* | 10/2017 | Stein .................. H04B 7/18528 |

* cited by examiner

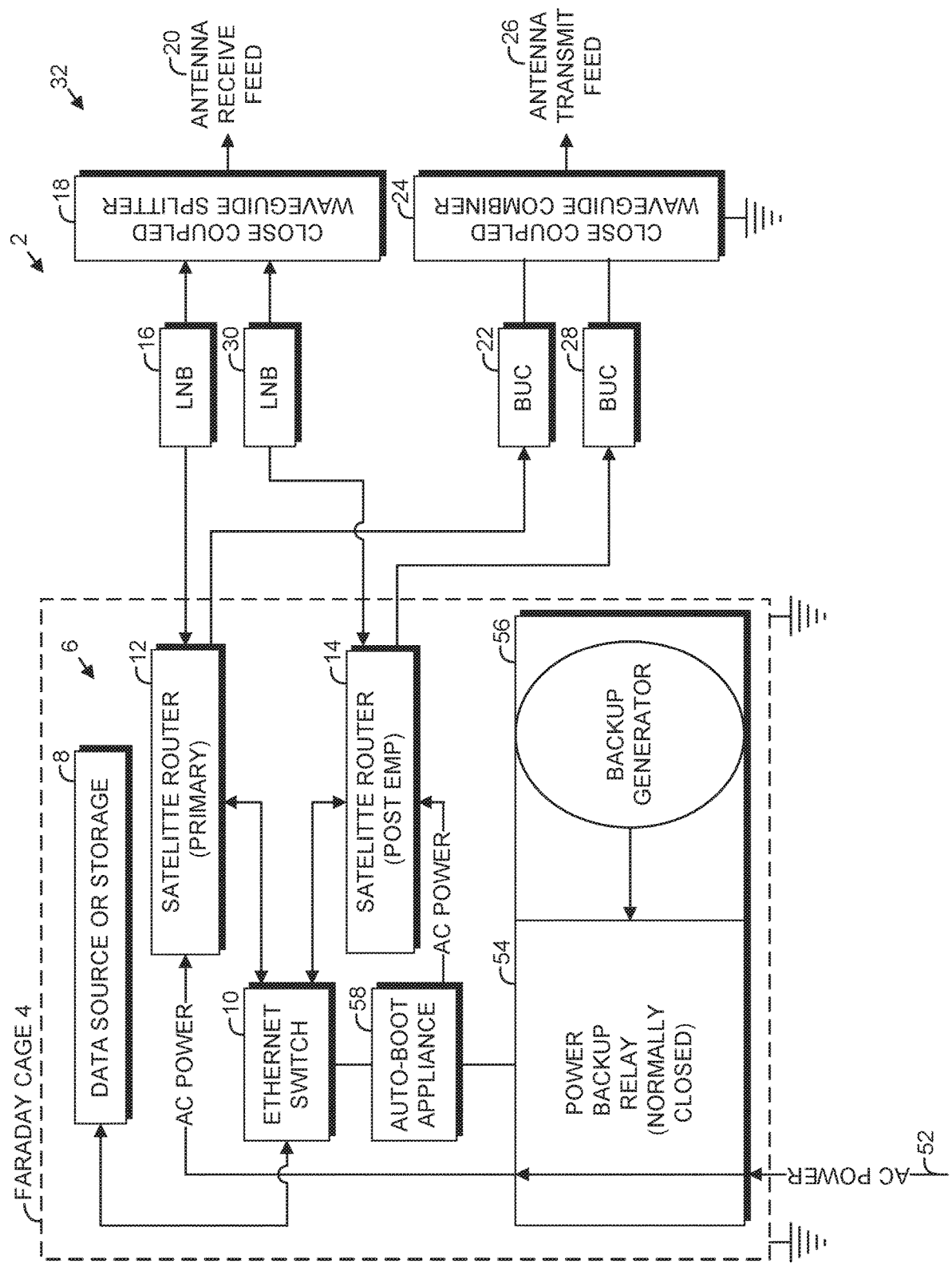

EMP-RESISTANT SATELLITE COMMUNICATIONS SYSTEM AND METHOD

CROSS-REFERENCE TO RELATED APPLICATION

This application claims priority in U.S. Provisional Patent Application No. 62/775,456, filed Dec. 5, 2018, which is incorporated herein by reference.

BACKGROUND OF THE INVENTION

1. Field of the Invention

The present invention relates generally to shielding communications from the effects of electromagnetic pulses (EMPs), and in particular to a system and method utilizing a Faraday cage for very small aperture terminal (VSAT) and C-band small aperture terminal (CSAT) applications.

2. Description of the Related Art

Electromagnetic pulses (EMPs) can occur naturally with solar flares, lightning and other natural phenomena. They can be artificially induced with electrical devices producing radio frequency (RF) signals. EMPs can be used for deliberately jamming RF signals, and thereby disrupting communications. For example, transmitting high-power RF signals on target carrier frequencies can interfere with data transmissions on those frequencies. Such techniques can be used against adversaries for exploiting vulnerabilities in their communication infrastructures. Effectively shielding telecommunication systems from EMP threats can significantly reduce such vulnerabilities.

The EMP Commission, appointed by the U.S. government, reported to Congress that satellite communications networks could be vulnerable to EMP attack. Based on the pervasiveness of satellite communications throughout commerce, defense, education, entertainment and other applications, such attacks could have devastating economic, national security and public safety consequences. For example, credit and debit card transactions are commonly process using satellite transmissions. Telephone communications also rely heavily on satellite transmissions. The worldwide network (Internet) could also be vulnerable to EMP attacks.

Heretofore there has not been available a system and method for providing resistance to EMP interference with the advantages and features of the present invention.

BRIEF DESCRIPTION OF THE DRAWING

The drawings constitute a part of this specification and include exemplary embodiments of the present invention illustrating various objects and features thereof.

FIG. 1 is a schematic, block diagram of an EMP-resistant satellite communication system embodying an aspect of the present invention.

DETAILED DESCRIPTION OF THE PREFERRED EMBODIMENTS

I. Introduction and Environment

As required, detailed aspects of the present invention are disclosed herein, however, it is to be understood that the disclosed aspects are merely exemplary of the invention, which may be embodied in various forms. Therefore, specific structural and functional details disclosed herein are not to be interpreted as limiting, but merely as a basis for the claims and as a representative basis for teaching one skilled in the art how to variously employ the present invention in virtually any appropriately detailed structure.

Certain terminology will be used in the following description for convenience in reference only and will not be limiting. For example, up, down, front, back, right and left refer to the invention as orientated in the view being referred to. The words, "inwardly" and "outwardly" refer to directions toward and away from, respectively, the geometric center of the aspect being described and designated parts thereof. Forwardly and rearwardly are generally in reference to the direction of travel, if appropriate. Said terminology will include the words specifically mentioned, derivatives thereof and words of similar meaning.

II. EMP-Resistant Telecommunications System 2 and Method

Referring to the drawing in more detail, FIG. 1 shows an EMP-resistant satellite communications system 2 including a Faraday cage 4 enclosing and shielding a core component subsystem 6. The Faraday cage 4 is scalable and can comprise an entire building, a room or an equipment enclosure. The subsystem 6 includes a data source or storage component 8 configured for receiving input from and providing output to other components via an ethernet switch 10.

An AC power source 52 is connected to the core component subsystem 6 via a power backup relay 54, which is normally closed. A backup generator 56 is connected to the power backup relay 54. An auto-boot appliance 58 provides AC power to the post-EMP satellite router 14 and the ethernet switch 10. AC power is also provided to the primary satellite router 12. The system 2 can also include equipment 60 which is normally off and not powered.

The ethernet switch 10 provides output to and receives input from a primary satellite router 12 and a post-EMP satellite router 14. Alternatively, the system 2 can accommodate receive-only satellite communication installations. The primary satellite router 12 is connected to a primary low noise block (LNB) converter 16, which in turn is connected to a close-coupled waveguide splitter 18 providing an antenna receive feed 20.

The primary satellite router 12 is also connected to a primary block upconverter (BUC) 22, which in turn is connected to a close-coupled waveguide combiner 24 providing an antenna transmit feed 26.

The output of the post-EMP satellite router 14 is input to a BUC 28, which is connected to the close-coupled waveguide combiner 24 providing the antenna transmit feed 26. The post EMP satellite router 14 is also connected to a post EMP LNB converter 30, which in turn is connected to the close-coupled waveguide splitter 18 providing the antenna receive feed 20.

A dual antennae subsystem 32 (e.g., receive and transmit) can be connected to the LNBs 16, 30 and the BUCs 22, 28 at the antenna feeding the two port microwave splitters and combiners 18, 24. A Faraday cage can be placed around other components of the system 2, e.g., equipment connected to the antennae and the backup generator or alternator 56.

The system 2 utilizes the Faraday cage 4 to protect all components normally within a room or building for processing data together with the generator/alternator 56 as a backup to commercial line power. The Faraday cage is scalable and could include an entire building, room or equipment enclosure. The Faraday cage 4 for antenna-mounted electronics is grounded to the satellite antenna but preferably isolated from the antenna, e.g., with fiber gaskets or other insulating elements. Nylon or Teflon bolts and nuts can connect the isolated components to the antenna feeds or waveguide while a copper ground strap can connect the mesh Faraday cage 4 to the antennae. The mesh Faraday cage 4 can be contained within a standard fiberglass feed cover or within hub-mounted electronics. In either case, the result is a fully functional feed system of electronics (core component subsystem 6) within the grounded Faraday cage 4.

Inter-facility (IFL) cables between the antennae and the inside electronics/core components can be interconnected with either: double shielded wiring with the outside shield grounded at both ends; or with fiber optic cable with the optic transceivers located within the feed Faraday cage 4. In the event of the use of double shielded IFL cables, power to the feed is supplied through the coaxial cable. Fiber optic IFL cables can utilize localized shielded batteries or shielded, dedicated generators.

Transmit and receive package equipment 60, including electronics and antenna mounted equipment, can be non-powered (OFF). At such time that an EMP event renders commercial power inoperative or in the event of a local power outage, the backup power energizes and the internal power relay switches power output to the backup redundant electronics. When the commercial power is restored, power will resume to the primary equipment package. This latter feature is primarily intended to restore signals in the event of a non-EMP event or condition. Following an EMP event, all components should be checked to determine which components have failed in order to be replaced for future EMPs.

By way of non-limiting example, the Hybrid Dual-Band Satellite Communication System disclosed in U.S. Pat. No. 9,648,568, which is assigned to a common assignee herewith and is incorporated herein by reference, could be EMP-protected with technology disclosed in the present application, e.g., Faraday cages, It is to be understood that while certain embodiments and/or aspects of the invention have been shown and described, the invention is not limited thereto and encompasses various other embodiments and aspects.

Having thus described the invention, what is claimed as new and desired to be secured by Letters Patent is:

1. An electromagnetic pulse (EMP) resistant telecommunications system, which comprises:
   a core component subsystem including a data source with a data storage component;
   a primary satellite router;
   a post-EMP satellite router;
   an ethernet switch configured for directing signals from said data source to one of said primary and post-EMP satellite routers;
   a Faraday cage enclosing said core component subsystem and configured for resisting EMP interference;
   an antenna subsystem connected to said satellite routers;
   said antenna subsystem including an antenna receive feed and an antenna transmit feed;
   said satellite routers connected to said antenna feeds; and
   a close coupled waveguide splitter connected to said LNBs and said antenna receive feed.

2. The telecommunications system according to claim 1, which includes:
   a backup generator selectively connected to said core component subsystem.

3. The telecommunications system according to claim 1, which includes:
   a primary low noise block (LNB) connected to said primary satellite router and said antenna subsystem; and
   a post-EMP LNB connected to said primary satellite router and said antenna subsystem.

4. The telecommunications system according to claim 3, which includes:
   a primary block upconverter (BUC) connected to said primary satellite router and said antenna subsystem; and
   a post-EMP BUC connected to said post-EMP satellite router and said antenna subsystem.

5. The telecommunications system according to claim 1, which includes:
   said core component subsystem including a power backup relay selectively connected to said satellite routers.

6. The telecommunications system according to claim 5, which includes:
   said backup generator connected to said power backup relay and configured for providing AC power to said telecommunications system in the event of a power outage.

7. An electromagnetic pulse (EMP) resistant telecommunications system, which comprises:
   a core component subsystem including a data source with a data storage component;
   a primary satellite router;
   a post-EMP satellite router;
   an ethernet switch configured for directing signals from said data source to one of said primary and post-EMP satellite routers;
   a Faraday cage enclosing said core component subsystem and configured for resisting EMP interference;
   a backup generator selectively connected to said core component subsystem;
   an antenna subsystem connected to said satellite routers;
   said antenna subsystem including an antenna receive feed and an antenna transmit feed;
   said satellite routers connected to said antenna feeds;
   a primary low noise block (LNB) connected to said primary satellite router and said antenna subsystem;
   a post-EMP LNB connected to said primary satellite router and said antenna subsystem;
   a primary block upconverter (BUC) connected to said primary satellite router and said antenna subsystem; and
   a post-EMP BUC connected to said post-EMP satellite router and said antenna subsystem.

8. The telecommunications system according to claim 7, which includes:
   a close coupled waveguide combiner connected to said BUCs and said antenna transmit feed.

9. The telecommunications system according to claim 7, which includes:
   said core component subsystem including a power backup relay selectively connected to said satellite routers.

10. The telecommunications system according to claim 9, which includes:
    a backup generator connected to said power backup relay and configured for providing AC power to said telecommunications system in the event of a power outage.

11. An electromagnetic pulse (EMP) resistant telecommunications system, which comprises:

a core component subsystem including a data source with a data storage component;
a primary satellite router;
a post-EMP satellite router;
an ethernet switch configured for directing signals from said data source to one of said primary and post-EMP satellite routers;
a Faraday cage enclosing said core component subsystem and configured for resisting EMP interference;
an antenna subsystem connected to said satellite routers;
said antenna subsystem including an antenna receive feed and an antenna transmit feed;
said satellite routers connected to said antenna feeds; and
a close coupled waveguide splitter connected to said LNBs and said antenna receive feed.

12. An electromagnetic pulse (EMP) resistant telecommunications system, which comprises:
a core component subsystem including a data source with a data storage component;
a primary satellite router;
a post-EMP satellite router;
an ethernet switch configured for directing signals from said data source to one of said primary and post-EMP satellite routers;
a Faraday cage enclosing said core component subsystem and configured for resisting EMP interference;
a backup generator selectively connected to said core component subsystem;
an antenna subsystem connected to said satellite routers;
said antenna subsystem including an antenna receive feed and an antenna transmit feed;
said satellite routers connected to said antenna feeds;
a primary low noise block (LNB) connected to said primary satellite router and said antenna subsystem;
a post-EMP LNB connected to said primary satellite router and said antenna subsystem;
a primary block upconverter (BUC) connected to said primary satellite router and said antenna subsystem; and
a close coupled waveguide combiner connected to said BUCs and said antenna transmit feed.

* * * * *